US010451687B1

(12) United States Patent
Tani et al.

(10) Patent No.: US 10,451,687 B1
(45) Date of Patent: Oct. 22, 2019

(54) POWER CONVERTER AND DIAGNOSTIC SYSTEM THEREOF

(71) Applicant: Hitachi, Ltd., Tokyo (JP)

(72) Inventors: Kazuki Tani, Tokyo (JP); Yoshinobu Kimura, Tokyo (JP); Takashi Ogawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/360,046

(22) Filed: Mar. 21, 2019

(30) Foreign Application Priority Data

Apr. 9, 2018 (JP) ................................ 2018-074378

(51) Int. Cl.
| | | |
|---|---|---|
| *H02M 7/5395* | (2006.01) | |
| *G01R 31/40* | (2014.01) | |
| *H02M 1/088* | (2006.01) | |
| H02P 27/06 | (2006.01) | |
| H02M 1/00 | (2006.01) | |

(52) U.S. Cl.
CPC ............ *G01R 31/40* (2013.01); *H02M 1/088* (2013.01); *H02M 7/5395* (2013.01); *H02M 2001/0009* (2013.01); *H02P 27/06* (2013.01)

(58) Field of Classification Search
CPC ...... H02M 1/088; H02M 7/5395; H02M 7/42; H02M 2001/0009; H02M 2007/4803; H02P 27/06; H02P 29/02; H02P 29/00; G01R 31/40

See application file for complete search history.

(56) References Cited

U.S. PATENT DOCUMENTS

| | | | | |
|---|---|---|---|---|
| 2009/0066384 A1* | 3/2009 | Suzuki | ..................... | G06F 1/025 327/184 |
| 2011/0181292 A1* | 7/2011 | Oowada | ................. | G01R 35/00 324/537 |
| 2014/0092655 A1* | 4/2014 | Igarashi | .................. | B60L 3/003 363/56.03 |
| 2019/0146026 A1* | 5/2019 | Kimura | .................... | B60L 3/003 |
| 2019/0229663 A1* | 7/2019 | Ogawa | .................. | H02P 21/141 |

FOREIGN PATENT DOCUMENTS

| | | |
|---|---|---|
| JP | 09-172782 A | 6/1997 |
| JP | 2010-011660 A | 1/2010 |

\* cited by examiner

*Primary Examiner* — Adolf D Berhane
(74) *Attorney, Agent, or Firm* — Mattingly & Malur, PC (57) ABSTRACT

A power converter is provided with a power semiconductor module having a switching element. The power converter includes a gate drive circuit, a first detection unit, a second detection unit, a time measuring unit, and an abnormality diagnostic unit. The gate drive circuit drives the switching element and outputs a feedback signal based on a switching operation of the switching element. The first detection unit detects a change in a feedback signal of an upper arm of the power converter. The second detection unit detects a change in a feedback signal of a lower arm of the power converter. The time measuring unit measures a difference between detection timings of a signal change by the first detection unit and a signal change by the second detection unit. The abnormality diagnostic unit performs diagnosis of the power converter based on a measurement result by the time measuring unit.

15 Claims, 7 Drawing Sheets

POWER CONVERTER AND DIAGNOSTIC SYSTEM THEREOF

CLAIM OF PRIORITY

The present application claims priority from Japanese Patent application serial no. 2018-074378, filed on Apr. 9, 2018, the content of which is hereby incorporated by reference into this application.

BACKGROUND OF THE INVENTION

1. Field of the Invention

The present invention relates to the configuration of a power converter, and more particularly to a technique that is effective in the case of being applied to diagnosis of a large-capacity power converter.

2. Description of the Related Art

In power converters such as control applications of electric motors for railroads and large industrial equipment and large-capacity frequency converters for electric power systems, power control of high voltage and large current is performed using a large capacity power semiconductor element.

In such a device, if a failure occurs during operation, system damage or unplanned system shutdown occurs, which may cause a large economic loss. For the purpose of preventing such a situation, it is necessary to detect deterioration and abnormality of the power converter, to prevent destruction due to function stop, to notify concerned parties of necessity of maintenance, and to extend the life of the power converter.

In the power converter, highly efficient power conversion is realized by precisely controlling a semiconductor switching element.

However, when any abnormality occurs in the timing of control of a semiconductor switching element, for example, when semiconductor switching elements constituting an upper arm and semiconductor switching elements constituting a lower arm are turned on at the same time, the semiconductor switching elements are short-circuited, which may result in element deterioration due to overheating and heavy equipment failure due to short circuit breakdown.

For this reason, as a technique for monitoring a state of the power converter by a simple method, a technique for detecting a control abnormality during the system operation and a timing abnormality in switching has been studied.

As a background technique in this technical field, there is a technique such as JP 2010-11660 A, for example. JP 2010-11660 A discloses "a technique for detecting the on/off state of a semiconductor switching element and monitoring the consistency with a control signal".

In addition, JP H09-172782 A discloses "a technique of checking whether the switching timing of a semiconductor element is normal at the time of maintenance check of a power converter".

SUMMARY OF THE INVENTION

In the above-described JP 2010-11660 A, a technique for detecting a time difference from a control signal to a feedback signal is disclosed, but a time difference of switching between an upper arm switching element and a lower arm switching element is not taken into consideration.

As described above, when the upper and lower arms are turned on at the same time, a short-circuited state occurs. Therefore, the time difference between the switching elements of the upper arm and the switching elements of the lower arm is an important parameter to the reliability of the power converter.

Further, JP H09-172782 A discloses a technique of measuring the time difference of switching between the switching elements of the upper arm and the switching elements of the lower arm in a state in which large current/large voltage is not applied at the time of maintenance inspection. However, measurement under actual operating conditions where large current/large voltage is applied is not considered.

Since the switching timing varies depending on voltage/current applied to a main circuit device, measurement in a state where the current/voltage is not applied is insufficient, and it is important to measure the time difference between the switching elements of the upper arm and the switching elements of the lower arm during actual operation.

It is therefore an object of the present invention to provide, in a power converter having a plurality of power semiconductor modules, a highly reliable power converter capable of highly accurately detecting a control abnormality of a semiconductor switching element with a relatively simple configuration, a diagnostic system and a diagnostic method of the power converter, and a motor control system using them.

To solve the above problem, according to the present invention, a power converter is provided with a power semiconductor module having a switching element, and the power converter includes a gate drive circuit, a first detection unit, a second detection unit, a time measuring unit, and an abnormality diagnostic unit. The gate drive circuit drives the switching element and outputs a feedback signal based on a switching operation of the switching element. The first detection unit detects a change in a feedback signal of an upper arm of the power converter. The second detection unit detects a change in a feedback signal of a lower arm of the power converter. The time measuring unit measures a difference between a detection timing of the signal change by the first detection unit and a detection timing of the signal change by the second detection unit. The abnormality diagnostic unit performs diagnosis of the power converter based on a measurement result by the time measuring unit.

Further, according to the present invention, a diagnostic system of a power converter is provided with a plurality of power semiconductor modules, a gate drive circuit, a first detection unit, a second detection unit, a time measuring unit, an abnormality diagnostic unit, and a display unit. The power semiconductor modules have a switching element. The gate drive circuit drives the switching element and outputs a feedback signal based on a switching operation of the switching element. The first detection unit detects a change in a feedback signal of an upper arm of the power converter. The second detection unit detects a change in a feedback signal of a lower arm of the power converter. The time measuring unit measures a difference between a detection timing of the signal change by the first detection unit and a detection timing of the signal change by the second detection unit. The abnormality diagnostic unit performs diagnosis of the power converter based on the measurement result by the time measuring unit. The display unit outputs a diagnosis result of the abnormality diagnostic unit.

Advantageous Effects of Invention

According to the present invention, in a power converter having a plurality of power semiconductor modules, abnormality and damage of the power converter can be detected with high accuracy with a relatively simple configuration.

As a result, it is possible to provide a power converter, a diagnostic system and a diagnostic method of the power converter, which are excellent in reliability and economy, and a motor control system using the same.

Issues, configurations, and effects other than the above are clarified by descriptions of the following embodiments.

BRIEF DESCRIPTION OF THE DRAWINGS

FIG. 2 is a graph indicating a gate-emitter voltage waveform and a feedback signal when a power semiconductor module is switched on;

DESCRIPTION OF THE PREFERRED EMBODIMENTS

Embodiments of the present invention will be described below with reference to the drawings. In each drawing, the same components are denoted by the same reference numerals, and a detailed description thereof will be omitted for overlapping portions.

First Embodiment

With reference to FIGS. 1 to 7, a power converter and a diagnostic system of the power converter, and an electric motor control system using the same according to a first embodiment will be described.

Figure 1:
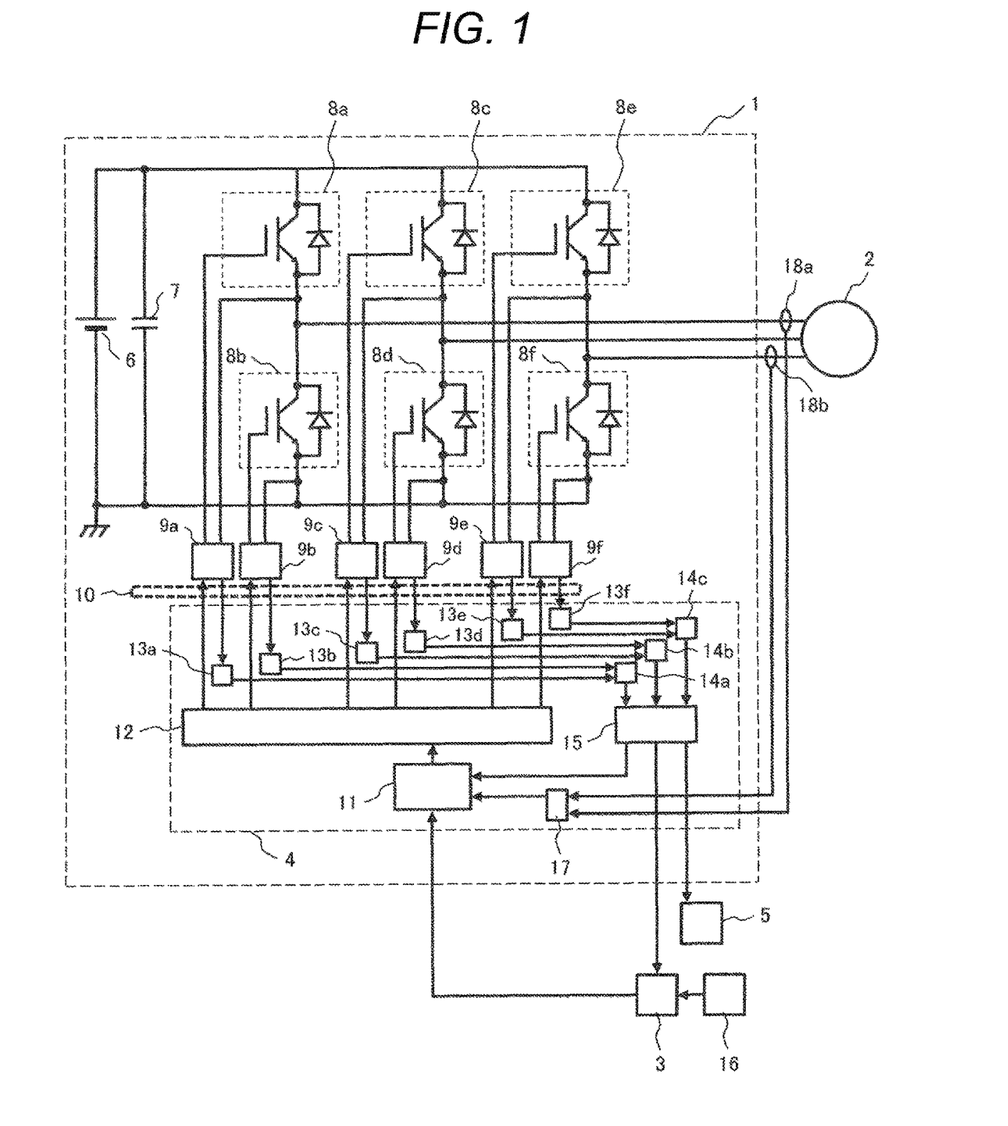
FIG. 1 is a block diagram illustrating the overall configuration of a diagnostic system of the power converter according to an embodiment of the present invention (First embodiment)

FIG. 1 is a block diagram illustrating the overall configuration of a diagnostic system of the power converter according to the present embodiment. As illustrated in FIG. 1, the system mainly includes a power converter 1, a three-phase electric motor 2 driven by the power converter 1 as a load, and a Graphical User Interface (GUI) 3 for monitoring a state of the power converter 1 and the electric motor 2. The power converter 1 includes a controller 4. Between the power converter 1 and the electric motor 2, current sensors 18a and 18b for measuring the phase current supplied to the electric motor 2 are disposed. In addition, the power converter 1 is provided with a power converter display unit 5 for displaying the presence/absence of abnormality by status monitoring.

The power converter 1 is a device that controls the electric motor 2 by converting a direct current voltage source 6 into a three-phase alternating voltage. The power converter 1 includes a smoothing capacitor 7, a plurality of power semiconductor modules 8a to 8f, gate drive circuits 9a to 9f, and the controller 4. The gate drive circuits 9a to 9f and the controller 4 are insulated by an insulating coupling element 10. For the insulating coupling element 10, for example, an optical coupling type element, a magnetic coupling type element, an electrostatic coupling type element, or the like is used. In FIG. 1, the gate drive circuits 9a to 9f are disposed outside the power semiconductor modules 8a to 8f, but they may be incorporated in the power semiconductor modules 8a to 8f, respectively.

In the power semiconductor modules 8a to 8f, for example, a transistor such as an insulated gate bipolar transistor (IGBT) and a diode such as a PN diode or a Schottky barrier diode are connected in antiparallel to each other. Each of the power semiconductor modules 8a to 8f is provided with an emitter terminal, a collector terminal, and a gate terminal. Although the IGBT is used for the power semiconductor modules 8a to 8f in the present embodiment, in the case of using a MOSFET, it suffices to read the emitter terminal as a source terminal and the collector terminal as a drain terminal.

The controller 4 includes a logic unit 11, a control unit 12, signal change detection units 13a to 13f, time measuring units 14a to 14c, an abnormality diagnostic unit 15, and a current detection unit 17.

The control unit 12 transmits the pulse width modulation (PWM) command signal from the logic unit 11 to the gate drive circuits 9a to 9f. A predetermined switch-on reference voltage and a switch-off reference voltage are preset in the gate drive circuits 9a to 9f, and by comparing the voltage between a gate terminal and an emitter terminal during the switching operation, a feedback signal is transmitted to the signal change detection units 13a to 13f.

The signal change detection units 13a to 13f are constituted by operational amplifiers, comparators, high-pass filters, and the like, detect a change in the feedback signal due to a switching operation, and transmit the signal to the time measuring units 14a to 14c.

The time measuring units 14a to 14c measure a time difference of a signal between upper and lower arms of the same phase (that is, between the signal change detection unit 13a and the signal change detection unit 13b, between the signal change detection unit 13c and the signal change detection unit 13d, between the signal change detection unit 13e and the signal change detection unit 13f) and transmit the measured time difference to the abnormality diagnostic unit 15.

The abnormality diagnostic unit 15 diagnoses the presence or absence of abnormality of the switching control based on the transmitted time difference and transmits a diagnosis result to the logic unit 11. In addition, the abnormality diagnostic unit 15 displays (outputs) the diagnosis result on the GUI 3 and the power converter display unit 5 disposed outside the power converter 1.

From the GUI 3, a user can input an operation command of the power converter 1 based on the logic unit 11 and an environment information acquisition unit 16 (weather data, load data, etc.), and the input data is transmitted to the logic unit 11.

Based on the input data from the GUI 3, the data of the abnormality diagnostic unit 15, the data of the current detection unit 17, and the weather information and load information from the environment information acquisition unit 16, the logic unit 11 calculates (computes) the switching timing of the power semiconductor modules 8a to 8f. Based on the calculation (computation) result at the logic unit 11, the control unit 12 transmits to the gate drive circuits 9a to 9f relaxation drive commands for limiting the maximum current and expanding a margin of the switching timing.

The gate drive circuits 9a to 9f relax drive the power semiconductor modules 8a to 8f, and a relaxation drive result is transmitted to the GUI 3. The relaxation drive of the power semiconductor modules 8a to 8f can also be given in instruction directly by a user from the GUI 3. On the GUI 3, a maintenance instruction of the power converter 1 is displayed based on a diagnosis result of the abnormality diagnostic unit 15 after relaxation drive.

As a specific configuration example of the diagnostic system of the present embodiment, it is preferable that a memory circuit is provided for storing time series data of relaxation drive command, time series data of current detection unit data, weather data, load data, and time series data of the time measuring units 14a to 14c and the abnormality diagnostic unit 15. This is because calculation (computation) of switching timing with further high accuracy and relaxation drive control of a power semiconductor module can be performed based on past data.

In addition, the logic unit 11 and the abnormality diagnostic unit 15 may be configured as an integrated unit. For example, by incorporating the abnormality diagnostic unit 15 in the logic unit 11, the time lag (time difference) of communication between the logic unit 11 and the abnormality diagnostic unit 15 is eliminated, and it makes further highly accurate control possible.

In a specific application example of the present system, each of the signal change detection units 13a to 13f, the time measuring units 14a to 14c, and the abnormality diagnostic unit 15 may be configured integrally with the power converter 1 or may be connected by any of wired communication, wireless communication, and detachable connection by terminal connection.

The user interface unit (GIU 3) may be integrated with the abnormality diagnostic unit 15, or the GUI 3 and the abnormality diagnostic unit 15 may be connected by any one of wired communication, wireless communication, and detachable connection by terminal connection. By separately disposing each unit and connecting each unit by wired communication or wireless communication, the degree of freedom of the system configuration is increased, and for example, it is also possible to diagnose the power converter mounted on a train or the like to be described later with a monitoring system located at a remote place.

The signal change detection units 13a to 13f include an operational amplifier, a high-pass filter, a comparator, and the like and transmit a signal of a rectangular wave of 3.3 V or 5 V to the time measuring units 14a to 14c. As an example of the time measuring units 14a to 14c, a configuration using a TDC (Time-to-Digital-Converter) circuit and a microcomputer is conceivable.

Another aspect of the present embodiment is a diagnostic method of a power converter that includes a semiconductor switching element and performs a switching operation for conducting and interrupting a main current. In this method, a function of determining abnormality of control based on the time difference of feedback signal change of the power semiconductor modules of the upper and lower arms is provided.

Next, the specific operation of the diagnostic system of the present embodiment will be described with reference to FIGS. 2 to 5C.

Figure 2:
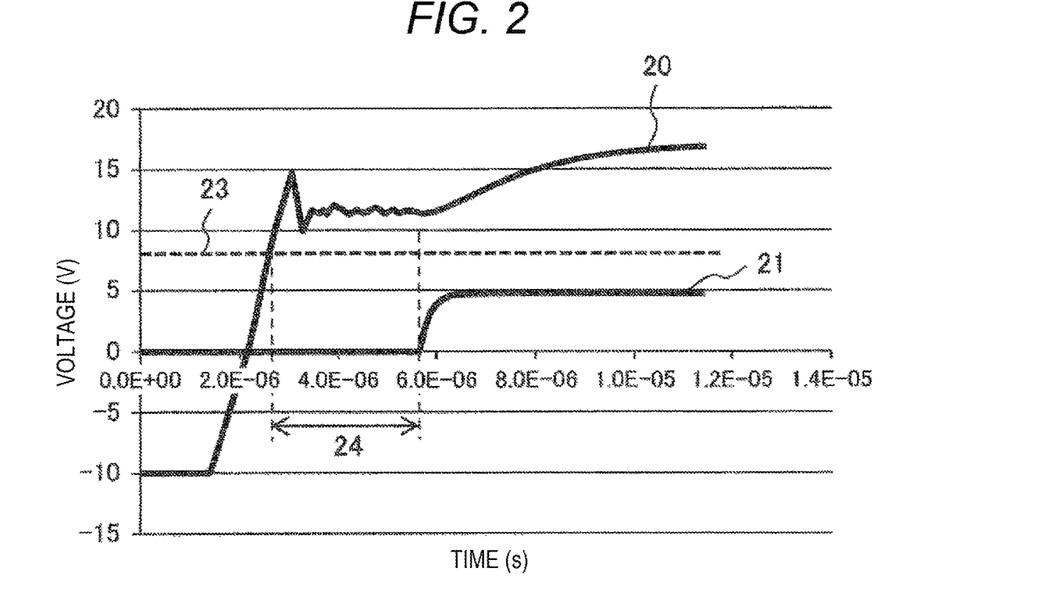

FIG. 2 indicates a transition of a waveform of a gate-emitter voltage 20 and a feedback signal 21 when a power semiconductor module is switched on (turned on). When the gate-emitter voltage 20 rises and exceeds the predetermined switch-on reference voltage 23, after a lapse of the circuit delay time 24 of the gate drive circuits 9a to 9f, the feedback signal 21 is output by a comparator incorporated in the gate drive circuits 9a to 9f and transmitted to the signal change detection units 13a to 13f via the insulating coupling element 10.

Figure 3:
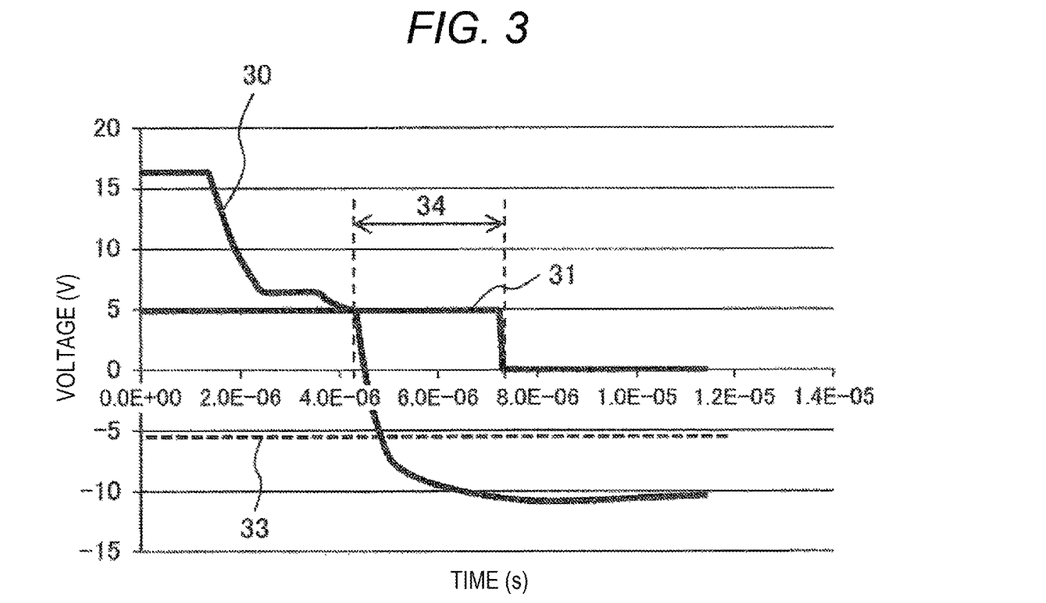
FIG. 3 is a graph indicating a gate-emitter voltage waveform and a feedback signal when a power semiconductor module is switched off.

FIG. 3 indicates a transition of a waveform of a gate-emitter voltage 30 and a feedback signal 31 when the power semiconductor module is switched off (turned off). When the gate-emitter voltage 30 lowers and exceeds a predetermined switch-off reference voltage 33, after a lapse of a circuit delay time 34 of the gate drive circuits 9a to 9f, the feedback signal 31 is output by a comparator incorporated in the gate drive circuits 9a to 9f and transmitted to the signal change detection units 13a to 13f via the insulating coupling element 10.

The signal change detection units 13a to 13f convert an input feedback signal into a rising pulse signal at the time of switch-on (turn-on) and into a falling pulse signal at the time of switch off (turn off), transmit the signal to the time measuring units 14a to 14c, and do not output the signal in a period of no change.

The pulse signals (13a and 13b, 13c and 13d, 13e and 13f) of upper and lower arms of the same phase are input to the respective time measuring units 14a to 14c, and the time difference between the signals of the upper and lower arms is measured. The time (time difference) measured by the time measuring units 14a to 14c is transmitted to the abnormality diagnostic unit 15 to diagnose abnormality of the switching control.

Figure 4A:
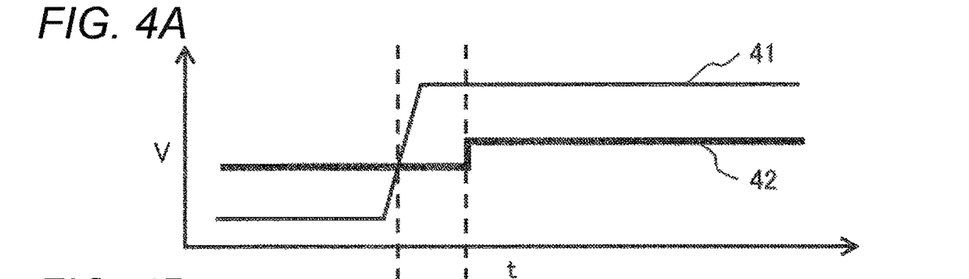
FIGS. 4A to 4C are graphs indicating a gate-emitter voltage waveform of upper and lower arms, a feedback signal, and a collector-emitter current waveform of the lower arm in the case of a dead time shortage abnormality.
Figure 4B:
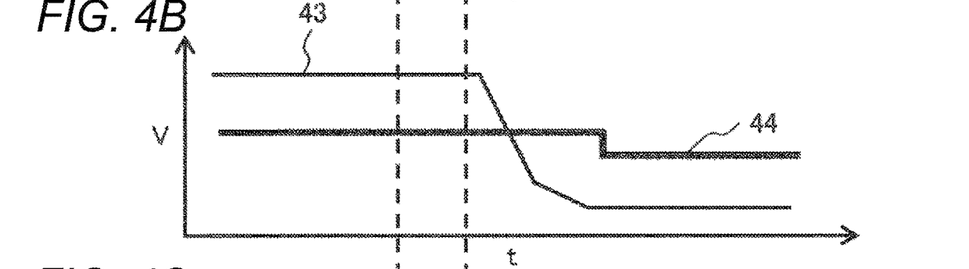
Figure 4C:
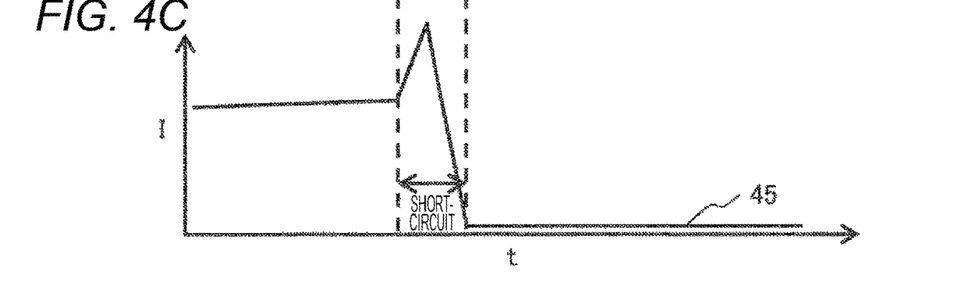

FIGS. 4A to 4C are schematic diagrams of insufficient dead time which is one of control abnormalities. FIG. 4A illustrates a transition of a gate-emitter voltage waveform 41 and a feedback signal 42 of power semiconductor modules 8a, 8c, and 8e constituting the upper arm. FIG. 4B illustrates a transition of a gate-emitter voltage waveform 43 and a feedback signal 44 of power semiconductor modules 8b, 8d, and 8f constituting the lower arm. FIG. 4C illustrates a transition of a collector-emitter current waveform 45 of the lower arm.

In the schematic diagrams of FIGS. 4A to 4C, since the switch-on of the upper arm is started before the switch-off of the lower arm is completed, a short circuit occurs in the period when both the upper and lower arms are switched on, and an excessive current flows through the element. As a result, short circuit breakdown may occur in some cases. Therefore, in order to avoid a state of insufficient dead time, it is necessary to take sufficient time difference between the switching of the upper and lower arms.

On the other hand, in order to improve the power conversion efficiency, it is necessary to set the time difference of the switching of the upper and lower arms to be short, and a trade-off relationship occurs between efficiency and reliability. Therefore, in order to achieve both high efficiency of power conversion and high reliability of control, dynamic switching time difference control by monitoring the time difference of switching of the upper and lower arms according to the present embodiment is important.

Figure 5A:
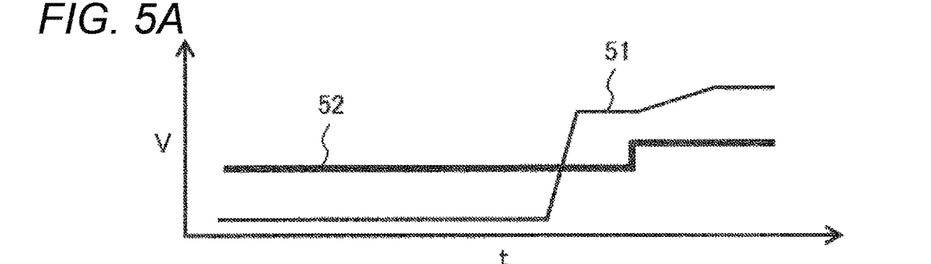
FIGS. 5A to 5C are graphs indicating a gate-emitter voltage waveform of upper and lower arms, a feedback signal, and a collector-emitter current waveform of the lower arm in the case of a self turn-on abnormality.
Figure 5B:
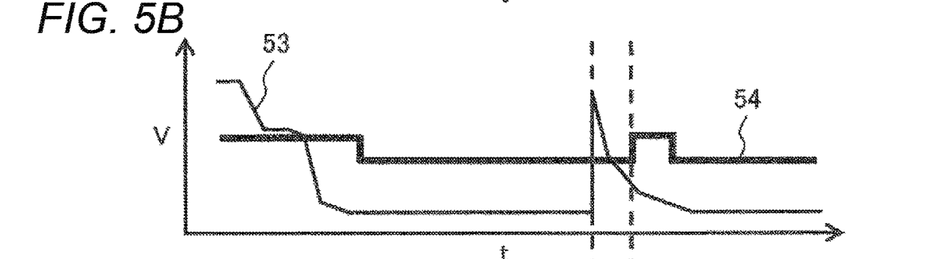
Figure 5C:
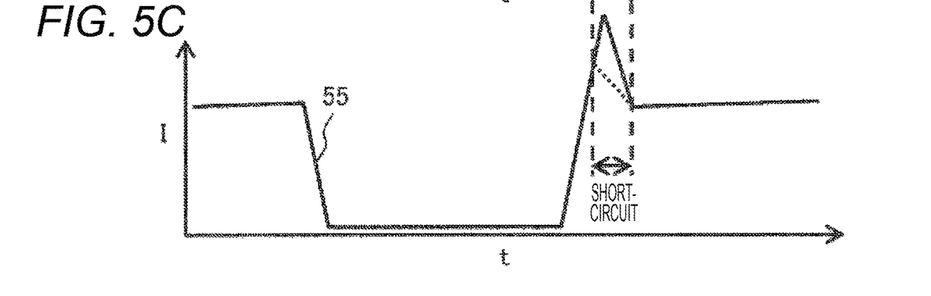

FIGS. 5A to 5C illustrate another example of insufficient dead time which is one of control abnormalities. FIG. 5A illustrates a transition of a gate-emitter voltage waveform 51 and a feedback signal 52 of the power semiconductor modules 8a, 8c, and 8e constituting the upper arm. FIG. 5B illustrates a transition of a gate-emitter voltage waveform 53 and a feedback signal 54 of the power semiconductor modules 8b, 8d, and 8f constituting the lower arm. FIG. 5C illustrates a transition of a collector-emitter current waveform 55 of the lower arm.

The schematic diagrams of FIGS. 5A to 5C indicate a self turn-on failure in which after the lower arm is switched off, the gate voltage of the lower arm element temporarily rises when the upper arm is switched on, the lower arm element is switched on, and it causes short circuit between the upper and lower arms. The reason why the gate voltage of the lower arm element temporarily rises is that current flows into a gate via a gate-collector capacitance of the lower arm element because the collector-emitter voltage of the lower arm element abruptly changes when the upper arm element is switched on.

To suppress a self turn-on failure, normally, the switch-on speed is reduced, and the regulated capacity is inserted between a gate and an emitter. However, the former has a disadvantage that the power conversion efficiency is lowered, the latter has a disadvantage that the controllability is deteriorated due to an increase in capacitance between the gate and the emitter, and in order to optimize the control, it is necessary to monitor the self turn-on according to the present embodiment.

Table 1 shows the relationship between the outputs of the signal change detection units 13a to 13f of the upper and lower arms, the time measurement values of the time measuring units 14a to 14c, and the abnormality diagnosis output of the abnormality diagnostic unit 15.

When one of the upper arm and the lower arm is switched on for a period shorter than a predetermined period (including a negative period) after the other arm is switched off, it is determined that a dead time is insufficient. (Patterns of No. 2 and No. 6 in Table 1)

On the other hand, if one of the upper arm and the lower arm is switched on within a predetermined period after the other arm is switched off, it is determined to be normal. (Patterns No. 1 and No. 5 in Table 1)

If one of the upper arm and the lower arm is switched off, and the other arm is switched on later than the predetermined period, it is determined that the turn-on failure has occurred. (Patterns of No. 3 and No. 7 in Table 1)

If one of the upper arm and the lower arm is switched on, and the other arm is switched on within a certain period of time, it is determined to be self turn-on. (Patterns of No. 4 and No. 8 in Table 1)

TABLE 1

| | No. | | | | | | | |
|---|---|---|---|---|---|---|---|---|
| | 1 | 2 | 3 | 4 | 5 | 6 | 7 | 8 |
| SIGNAL CHANGE DETECTION UNIT a (UPPER ARM) OUTPUT | ON | ON | ON | ON | OFF | OFF | OFF | ON |
| SIGNAL CHANGE DETECTION UNIT b (LOWER ARM) OUTPUT | OFF | OFF | OFF | ON | ON | ON | ON | ON |
| TIME MEASURING UNIT OUTPUT (DETECTION UNIT a → DETECTION UNIT b) | VALUE 1 < t < VALUE 2 | VALUE 2 < t | t < VALUE 1 | t < VALUE 4 | VALUE 5 < t < VALUE 6 | t < VALUE 7 | VALUE 1 < t | t < VALUE 4 |
| ABNORMALITY DIAGNOSIS OUTPUT | NORMAL | INSUFFICIENT DEAD TIME | TURN-ON FAILURE | SELF TURN ON | NORMAL | INSUFFICIENT DEAD TIME | TURN-ON FAILURE | SELF TURN ON |

Specific examples of the operation condition control by detecting a control abnormality include setting a limit value of the maximum current value of the power semiconductor modules 8a to 8f of the power converter 1 and performing relaxation drive to increase a margin of the time difference between switching of the upper arm and switching of the lower arm.

As a specific example of the switching element, an insulated gate bipolar transistor (IGBT), a metal oxide semiconductor field effect transistor (MOSFET), or the like can be used as a power semiconductor element.

Silicon (Si), silicon carbide (SiC), gallium nitride (GaN), or the like can be used as the semiconductor material of a switching element (power semiconductor element). In addition, as a switching element, a large capacity semiconductor module in which small capacity semiconductor chips are connected in parallel can be used.

Figure 6:
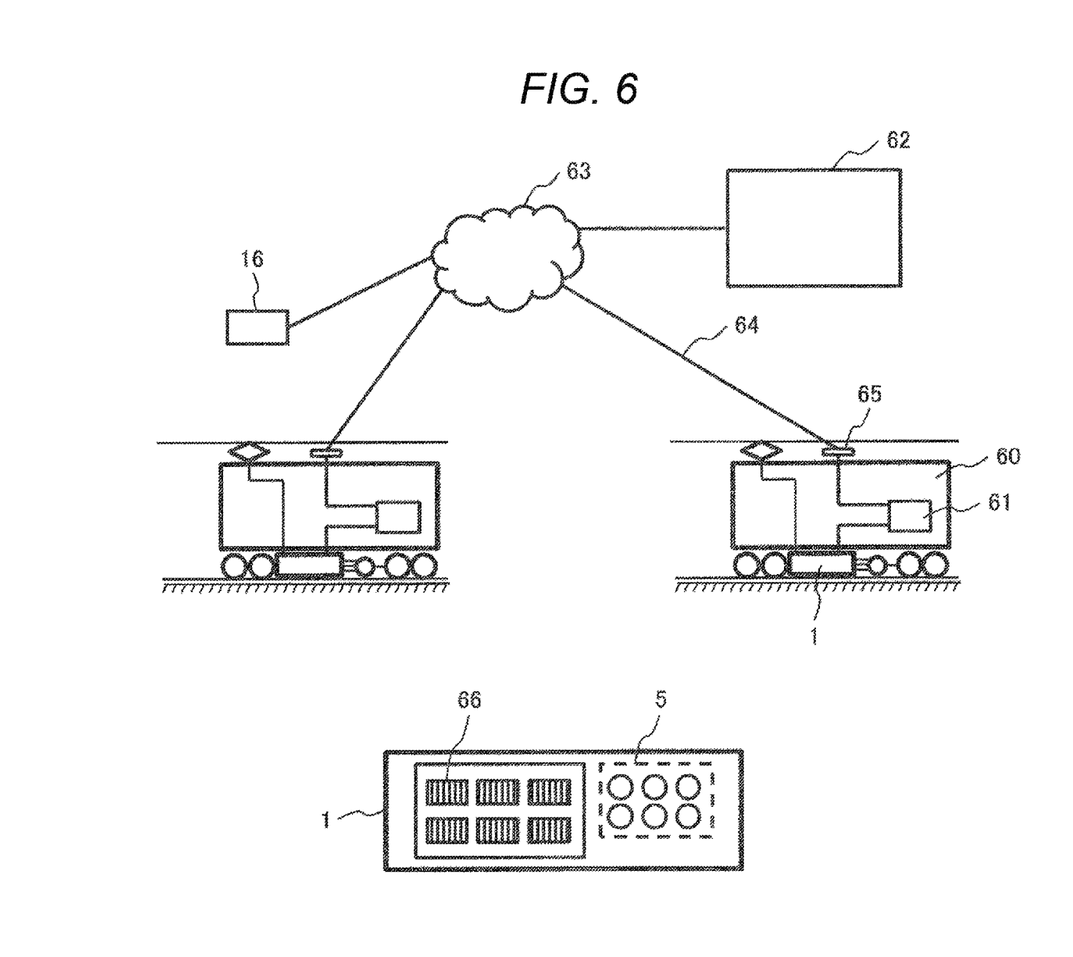
FIG. 6 is a diagram illustrating an application example of a diagnostic system of the power converter according to an embodiment of the present invention.

Next, an application example of the diagnostic system of the power converter according to the present embodiment will be described with reference to FIG. 6. FIG. 6 is a system block diagram in the case where the diagnostic system according to the present embodiment is applied to a railroad.

By disposing the power converter display unit 5 outside (at a position visible from the outside) the power converter 1 (for example, a VVVF inverter or the like) located in a lower portion of the railway vehicle 60, it is possible to notify a maintenance worker of diagnosis results of the abnormality diagnostic unit 15. In addition, since the location of the power semiconductor module in which the control abnormality occurs can be recognized (identified) on the spot, the maintenance work efficiency is improved.

In addition to the display indicating the control abnormality of the power semiconductor module, for example, a warning promoting cleaning (maintenance) of a cooler 66, for example, can be output to the power converter display unit 5.

A vehicle information integration system 61 is a system for monitoring air conditioning in the railway vehicle 60, the opening and closing state of a door, lighting, and the like, and is disposed in the driver's seat. The GUI 3 can be included in this vehicle information integration system 61. It is also possible to transmit the information of the GUI 3 to a central monitoring device 62 via a wireless path 64 via the Internet 63 which is a network by an antenna 65 disposed in the railway vehicle 60.

Further, by acquiring other vehicle information via the Internet 63, it is possible to formulate a further efficient maintenance plan. In addition, maintenance cost can be reduced by increasing the efficiency of arranging maintenance members. Further, by acquiring weather information and passenger information by the environment information acquisition unit 16, a further preferable vehicle arrangement is possible.

Figure 7:
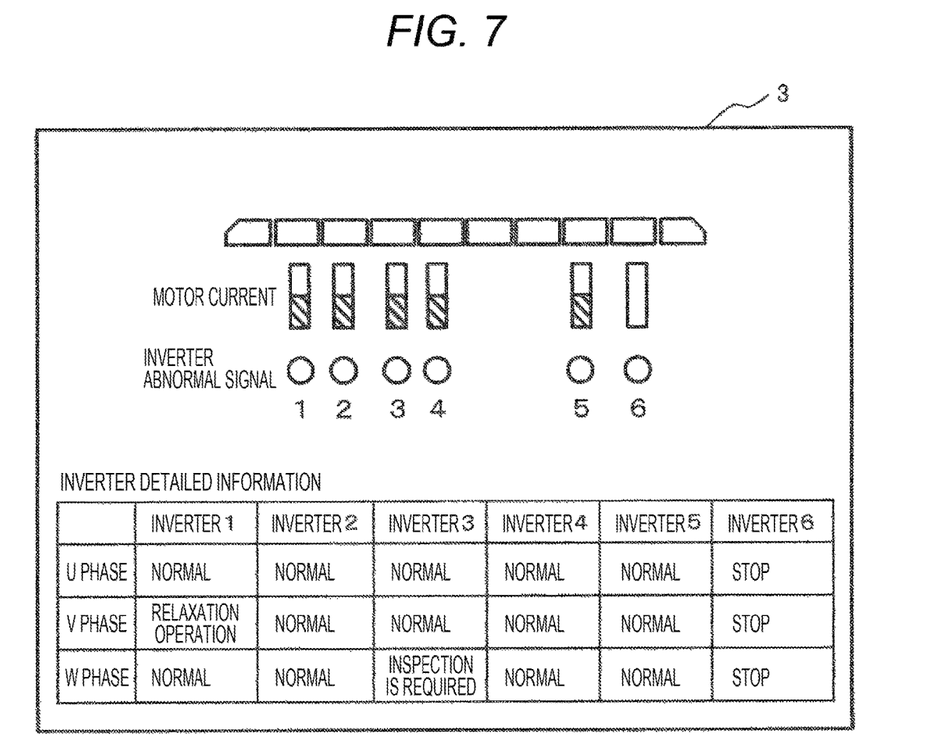
FIG. 7 is a diagram illustrating a GUI according to an embodiment of the present invention.

FIG. 7 illustrates one example of a specific configuration of the GUI 3 integrated with the central monitoring device 62. It is a display form in which the motor current of each vehicle and the presence or absence of abnormality of each inverter can be clearly discriminated, and detailed information of each phase (U phase, V phase, W phase) of each inverter can also be referred to. By configuring the diagnostic system of the power converter of the present embodiment in combination with the graphical user interface (GUI 3) as illustrated in FIG. 7, it becomes possible to monitor a plurality of vehicles and to optimize a maintenance plan.

As described above, according to the present embodiment, it is possible to highly precisely detect abnormality or damage of a power semiconductor device and a power converter using the power semiconductor device with a relatively simple configuration, prevent failures such as troubles, and make it usable for a long time.

Second Embodiment

Figure 8:
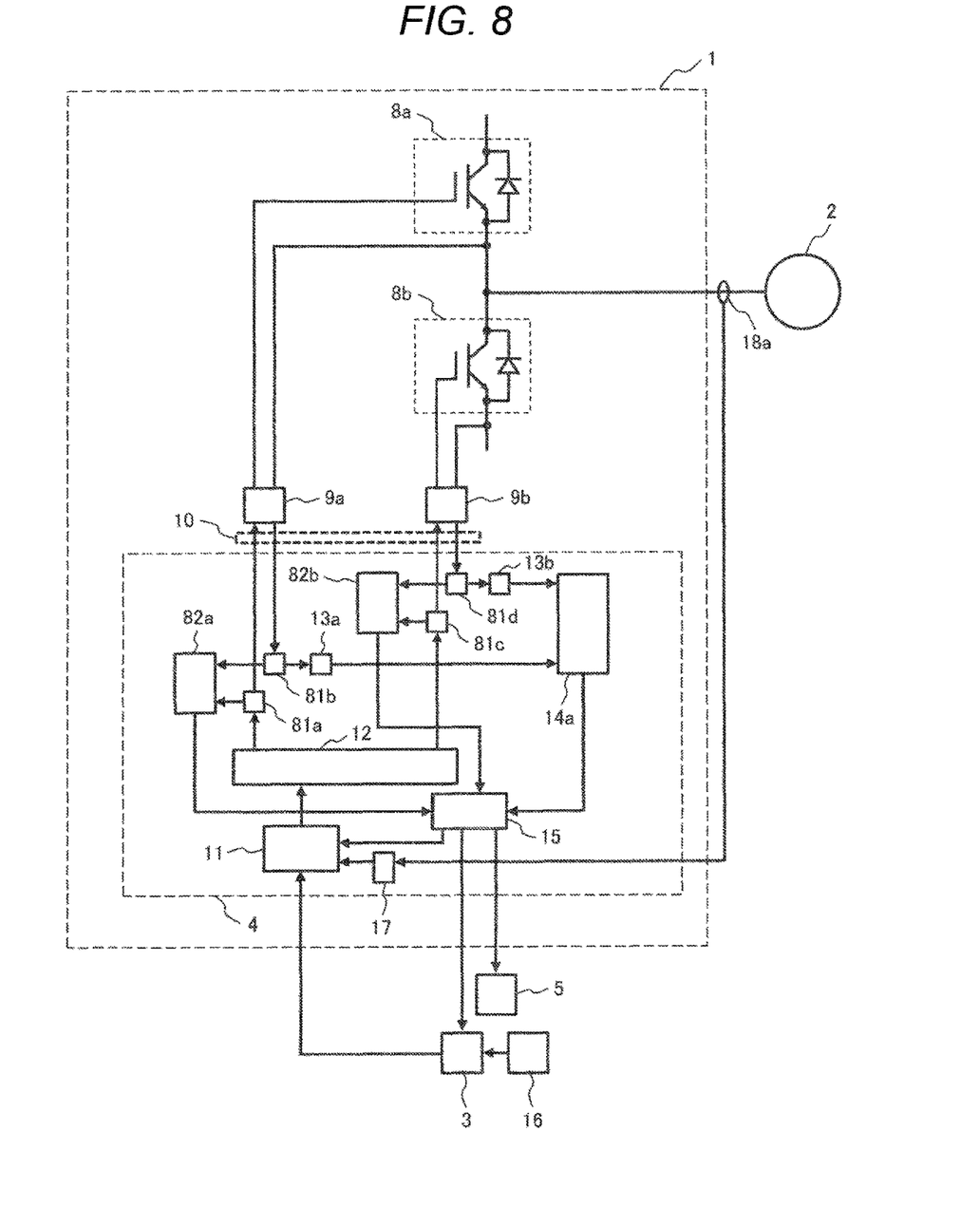
FIG. 8 is a block diagram illustrating a partial configuration of a diagnostic system of the power converter according to an embodiment of the present invention (Second embodiment).

With reference to FIG. 8, a power converter according to a second embodiment and a diagnostic system of the power converter will be described. FIG. 8 is a block diagram illustrating a partial configuration of the diagnostic system of the power converter according to the present embodiment. In the present embodiment, a configuration for giving redundancy to the control diagnostic unit (controller 4) will be described.

As illustrated in FIG. 8, the system mainly includes a power converter 1, a three-phase electric motor 2 driven by the power converter 1 as a load, and a GUI 3 for monitoring the state of the power converter 1 and the electric motor 2. In FIG. 8, in order to clarify the configuration, only one phase of a three-phase AC power is illustrated.

The configuration of the present embodiment illustrated in FIG. 8 will be described mainly from the difference from the first embodiment. In the diagnostic system of the present embodiment, signal dividers 81a to 81d are provided between a control unit 12 and an insulating coupling element 10 and between the insulating coupling element 10 and signal change detection units 13a and 13b. Signals are branched from the signal dividers 81a to 81d which branch off a command signal and a feedback signal to on/off state monitoring units 82a and 82b to determine the on/off state of the command signal and the feedback signal.

It is also conceivable to add a function of measuring a time difference to the on/off state monitoring units 82a and 82b and estimate an element junction temperature of a power semiconductor module 8b from the time difference between a command signal and a control signal.

The specific operation of the diagnostic system according to the present embodiment will be described. The diagnosis system transmits determination results (observation results) at signal change detection units 13a and 13b to an abnormality diagnostic unit 15 at regular intervals (for example, 1 μs interval) and compares the data with the data of the time measuring unit 14a input to an abnormality diagnostic unit 15. When the determination result (observation result) by the signal change detection units 13a and 13b is not consistent with the data of the time measuring unit 14a (for example, in the case where, although it is determined as an off state in the on/off state monitoring units 82a and 82b, a switch-on signal is output from the data of the measuring unit 14a), it is determined that the output of the time measuring unit 14a is erroneously detected and controlled such that the diagnostic result is not transmitted to the logic unit 11.

For this reason, for example, when the time measuring unit 14a erroneously detects data due to noise during operation of the system, it is possible to avoid transmitting erroneously detected data to the logic unit 11. Therefore, even when the time measuring unit 14a erroneously detects data by noise, it is possible to prevent control abnormality (for example, unnecessary relaxation drive, system shutdown, etc.) due to erroneous detection and to improve the reliability of the entire system.

As described above, according to the present embodiment, similarly to the first embodiment, it is possible to highly accurately detect abnormality or damage of a power semiconductor device and a power converter using the power semiconductor device with a relatively simple configuration, prevent troubles such as failures, and consequently extend the life of the power semiconductor device and the power converter.

In addition, by providing the signal dividers 81a to 81d and the on/off state monitoring units 82a and 82b in the controller 4 of the power converter 1, erroneous detection due to noise or the like can be prevented, and drive control at a stable load (electric motor 2) by the power converter 1 can be performed. The signal dividers 81a to 81d branch a pulse width modulation (PWM) command signal from the control unit 12 (logic unit 11) and a feedback signal from gate drive circuits 9a to 9f. The on/off state monitoring units 82a and 82b monitors on/off states of switching elements (power semiconductor modules) with signals from the signal dividers 81a to 81d as input.

The present invention is not limited to the above-described embodiments and includes various variations. For example, the above-described embodiments describe the present invention in detail for clarification, and every configuration described above may not be necessarily included. Further, a configuration of the embodiment can be partially replaced with a configuration of the other embodiment. Furthermore, a configuration of the embodiment can be added to a configuration of the other embodiment. Further, a part of a configuration of each embodiment can be added to, deleted from, and replaced with another configuration.

The present invention also has the following features.

[Appendix 1]

An electric motor control system for driving and controlling an electric motor includes:

a plurality of power semiconductor modules having a switching element;

a gate drive circuit for driving the switching element and outputting a feedback signal based on a switching operation of the switching element;

a first detection unit for detecting a change in a feedback signal of an upper arm of the power converter;

a second detection unit for detecting a change in a feedback signal of a lower arm of the power converter, a time measuring unit for measuring a difference between a detection timing of the signal change by the first detection unit and a detection timing of the signal change by the second detection unit; and an abnormality diagnostic unit for performing diagnosis of the power converter based on a measurement result by the time measuring unit.

[Appendix 2]

The electric motor control system according to Appendix 1, including:

a logic unit that calculates an operation timing of the switching element based on a diagnosis result of the abnormality diagnostic unit; and a control unit that outputs a command signal for controlling the gate drive circuit based on a calculation result obtained in the logic unit.

[Appendix 3]

The electric motor control system according to Appendix 2, including:

an on/off state monitoring unit that determines an on/off state of the switching element based on a feedback signal from the gate drive circuit and a command signal from the control unit.

[Appendix 4]

The electric motor control system according to Appendix 1, in which the gate drive circuit outputs the feedback signal when a gate-emitter voltage of the switching element exceeds a predetermined reference voltage.

[Appendix 5]

The electric motor control system according to Appendix 1, in which when a measurement result by the time measuring unit is less than a predetermined threshold, the abnormality diagnostic unit determines that a dead time of the power converter is insufficient.

[Appendix 6]

The electric motor control system according to Appendix 1, in which when a measurement result by the time measuring unit is within a predetermined range, the abnormality diagnostic unit determines that self turn-on of the power converter occurs.

[Appendix 7]

The electric motor control system according to Appendix 2, including:

a temperature detection unit that calculates a joint temperature of the switching element based on a feedback signal from the gate drive circuit and a command signal from the control unit.

[Appendix 8]

The electric motor control system according to Appendix 2, in which the abnormality diagnostic unit is incorporated in the logic unit.

[Appendix 9]

A diagnostic method for a power converter including a plurality of power semiconductor modules having switching elements, including:

detecting a change in a feedback signal of an upper arm and a change in a feedback signal of a lower arm of the power converter;

calculating a difference between the change in the feedback signal of the upper arm and the change of the feedback signal of the lower arm; and diagnosing the power converter based on the calculated difference.

[Appendix 10]

The diagnostic method of the power converter according to Appendix 9, including:

calculating an operation timing of the switching element based on a diagnosis result of the power converter; and controlling a gate drive circuit of the switching element based on the calculation result.

[Appendix 11]

The diagnostic method for a power converter according to Appendix 10, including:

determining an on/off state of the switching element based on a feedback signal from the gate drive circuit and a command signal to the gate drive circuit.

[Appendix 12]

The diagnostic method of the power converter according to Appendix 9, including:

outputting a feedback signal of the switching element when a gate-emitter voltage of the switching element exceeds a predetermined reference voltage.

[Appendix 13]

The diagnostic method of the power converter according to Appendix 9, including:

determining that a dead time of the power converter is insufficient when the calculated difference is less than a predetermined threshold.

[Appendix 14]

The diagnostic method of the power converter according to Appendix 9, including:

determining that self turn-on of the power converter has occurred when the calculated difference is within a predetermined range.

[Appendix 15]

The diagnostic method for a power converter according to Appendix 10, including:

calculating a joint temperature of the switching element based on a feedback signal from the gate drive circuit and a command signal to the gate drive circuit.

What is claimed is:

1. A power converter provided with a power semiconductor module having a switching element, the power converter comprising:

a gate drive circuit configured to drive the switching element and output a feedback signal based on a switching operation of the switching element;

a first detection unit configured to detect a change in a feedback signal of an upper arm of the power converter;

a second detection unit configured to detect a change in a feedback signal of a lower arm of the power converter;

a time measuring unit configured to measure a difference between a detection timing of the signal change by the first detection unit and a detection timing of the signal change by the second detection unit; and an abnormality diagnostic unit configured to perform diagnosis of the power converter based on a measurement result by the time measuring unit.

2. The power converter according to claim 1, comprising:

a logic unit configured to calculate an operation timing of the switching element based on a diagnosis result of the abnormality diagnostic unit; and a control unit configured to output a command signal for controlling the gate drive circuit based on a calculation result obtained in the logic unit.

3. The power converter according to claim 2, comprising an on/off state monitoring unit configured to determine an on/off state of the switching element based on a feedback signal from the gate drive circuit and a command signal from the control unit.

4. The power converter according to claim 1, wherein the gate drive circuit outputs the feedback signal when a gate-emitter voltage of the switching element exceeds a predetermined reference voltage.

5. The power converter according to claim 1, wherein when a measurement result by the time measuring unit is less than a predetermined threshold, the abnormality diagnostic unit determines that a dead time of the power converter is insufficient.

6. The power converter according to claim 1, wherein when a measurement result by the time measuring unit is within a predetermined range, the abnormality diagnostic unit determines that self turn-on of the power converter occurs.

7. The power converter according to claim 2, comprising: a temperature detection unit configured to calculate a joint temperature of the switching element based on a feedback signal from the gate drive circuit and a command signal from the control unit.

8. The power converter according to claim 2, wherein the abnormality diagnostic unit is incorporated in the logic unit.

9. A diagnostic system of a power converter comprising:
a plurality of power semiconductor modules having a switching element;
a gate drive circuit configured to drive the switching element and output a feedback signal based on a switching operation of the switching element;
a first detection unit configured to detect a change in a feedback signal of an upper arm of the power converter;
a second detection unit configured to detect a change in a feedback signal of a lower arm of the power converter;
a time measuring unit configured to measure a difference between a detection timing of the signal change by the first detection unit and a detection timing of the signal change by the second detection unit;
an abnormality diagnostic unit configured to perform diagnosis of the power converter based on a measurement result by the time measuring unit; and
a display unit configured to output a diagnosis result of the abnormality diagnostic unit.

10. The diagnostic system of the power converter according to claim 9, comprising:
a logic unit configured to calculate an operation timing of the switching element based on a diagnosis result of the abnormality diagnostic unit; and
a control unit configured to output a command signal for controlling the gate drive circuit based on a calculation result obtained in the logic unit.

11. The diagnostic system of the power converter according to claim 10, comprising an on/off state monitoring unit configured to determine an on/off state of the switching element based on a feedback signal from the gate drive circuit and a command signal from the control unit.

12. The diagnostic system of the power converter according to claim 9, wherein the gate drive circuit outputs the feedback signal when a gate-emitter voltage of the switching element exceeds a predetermined reference voltage.

13. The diagnostic system of the power converter according to claim 9, wherein when a measurement result by the time measuring unit is less than a predetermined threshold, the abnormality diagnostic unit determines that a dead time of the power converter is insufficient.

14. The diagnostic system of the power converter according to claim 9, wherein when a measurement result by the time measuring unit is within a predetermined range, the abnormality diagnostic unit determines that self turn-on of the power converter occurs.

15. The diagnostic system of the power converter according to claim 10, comprising:
a temperature detection unit configured to calculate a joint temperature of the switching element based on a feedback signal from the gate drive circuit and a command signal from the control unit.

* * * * *